United States Patent

Sheu

[11] Patent Number: 5,856,224
[45] Date of Patent: Jan. 5, 1999

[54] METHOD OF FABRICATING SPLIT-GATE FLASH MEMORY

[75] Inventor: Yau-Kae Sheu, Hsinchu, Taiwan

[73] Assignee: United Semiconductor Corp., Hsinchu, Taiwan

[21] Appl. No.: 46,061

[22] Filed: Mar. 23, 1998

[30] Foreign Application Priority Data

Jan. 14, 1998 [TW] Taiwan ................................. 87100409

[51] Int. Cl.$^6$ .............................................. H01L 21/8247
[52] U.S. Cl. ........................... 438/266; 438/279; 438/305
[58] Field of Search ................................. 438/257, 267, 438/279, 305, 203

[56] References Cited

U.S. PATENT DOCUMENTS

| | | |
|---|---|---|
| 4,852,062 | 7/1989 | Baker et al. . |
| 5,256,584 | 10/1993 | Hartmann . |
| 5,494,838 | 2/1996 | Chang et al. . |
| 5,597,751 | 1/1997 | Wang . |
| 5,633,185 | 5/1997 | Yiu et al. .................. 438/258 |
| 5,674,767 | 10/1997 | Lee et al. . |
| 5,705,416 | 1/1998 | Kim et al. . |

FOREIGN PATENT DOCUMENTS 62-125677A  6/1987  Japan ...................................... 438/203

*Primary Examiner*—Richard A. Booth
*Attorney, Agent, or Firm*—Knobbe, Martens, Olson & Bear LLP

[57] ABSTRACT

A method of fabricating split-gate slash memory can define source and drain regions by using a self-alignment process. Thus, the uniformity of the split-gate flash memory performance is better controlled. This method comprises a floating gate oxide layer, a first polysilicon layer and a mask layer formed sequentially over a first type substrate. The mask layer and the first polysilicon layer are patterned to form a floating gate. A photoresist layer is coated over the substrate and then a pattern is defined on the photoresist layer to expose portion of the substrate. Second type ions are implanted into the exposed substrate to form a drain region. Then, the photoresist layer is removed. An insulating layer is formed over the substrate and then is etched back to form spacers on one side of the floating gate. The second type ions are implanted into the substrate to form a source region. The spacers and the mask layer are removed. A control gate layer and a control gate are formed sequentially over the substrate.

8 Claims, 6 Drawing Sheets

5,856,224

METHOD OF FABRICATING SPLIT-GATE FLASH MEMORY

CROSS-REFERENCE TO RELATED APPLICATION

This application claims the priority benefit of Taiwan application serial no. 87100409, filed Jan. 14, 1998, the full disclosure of which is incorporated herein by reference.

BACKGROUND OF THE INVENTION

1. Field of the Invention

This invention relates in general to the fabrication of semiconductor integrated circuits (ICs), and more particularly to the fabrication of split-gate flash memory cells.

2. Description of Related Art

A flash memory is one of erasable programmable read-only memories (EPROM) and is also called a non-volatile memory device. Usually, EPROM comprises tow gates, floating gate and control gate. The purpose of a floating gate is to storage charges and the purpose of a control gate is to control data access. The control gate is located above the floating gate and they do not have contact with each other. The floating gate does not connect to any wiring lines but the control gate connects to word lines. The flash memory cell can erase data "block by block", so it can run with higher speed, for example, 1 to 2 seconds.

Recently, a split-gate flash memory has been developed. FIG. 1A through 1D show the manufacturing progression of a split-gate flash memory according to the conventional method. Referring to FIG. 1A, a photoresist layer 11 is formed over a substrate 10 and then a pattern is defined on the photoresist layer 11. Using photoresist layer 11 as a mask, ions, for example, N-type ions, are implanted into the substrate 10 to form source region 12 and drain region 13. Then, the photoresist layer 11 is stripped.

Next, referring to FIG. 1B, a gate oxide layer 14 and a polysilicon layer 16 are formed sequentially over the substrate 10. A pattern is defined on polysilicon layer 16 to form a floating gate 17 as shown in FIG. 1C.

Then, referring to FIG. 1D, a gate oxide layer 18, for example, a silicon dielectric layer, formed by thermal oxidation is formed over floating gate 17. A control gate 19 is formed over gate oxide layer 14 and gate oxide layer 18 by defining a polysilicon layer.

FIG. 2 shows a top view of the forementioned split-gate flash memory. Because source/drain regions are formed before floating gate formation, the alignment accuracy of floating gate to source/drain regions affects the channel length of L1, L2, L1', and L2'. Due to this misalignment, the length of L1 and L1' is not the same and the length of L2 and L2' is not the same. This misalignment results in poor uniformity of cell performance.

SUMMARY OF THE INVENTION

It is therefore an object of the present invention to provide a method for fabricating a split-gate flash memory to get the same channel length L1, L2 by using a self-alignment process.

It is another object of the present invention to provide a method for fabricating a split-gate flash memory to get better uniformity of cell performance by using a self-alignment process.

The present invention achieves the above-identified objects by providing a new method of fabricating split-gate flash memory, comprising a floating gate oxide layer, a first polysilicon layer and a mask layer formed sequentially over a first type substrate. The mask layer and the first polysilicon layer are patterned to form a floating gate. A photoresist layer is coated over the substrate and then a pattern is defined on the photoresist layer to expose portion of the substrate. Second type ions are implanted into the exposed substrate to form a drain region. Then, the photoresist layer is removed. An insulating layer is formed over the substrate and then is etched back to form spacers on one side of the floating gate. The second type ions are implanted into the substrate to form a source region. The spacers and the mask layer are removed. A control gate layer and a control gate are formed sequentially over the substrate.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1A:
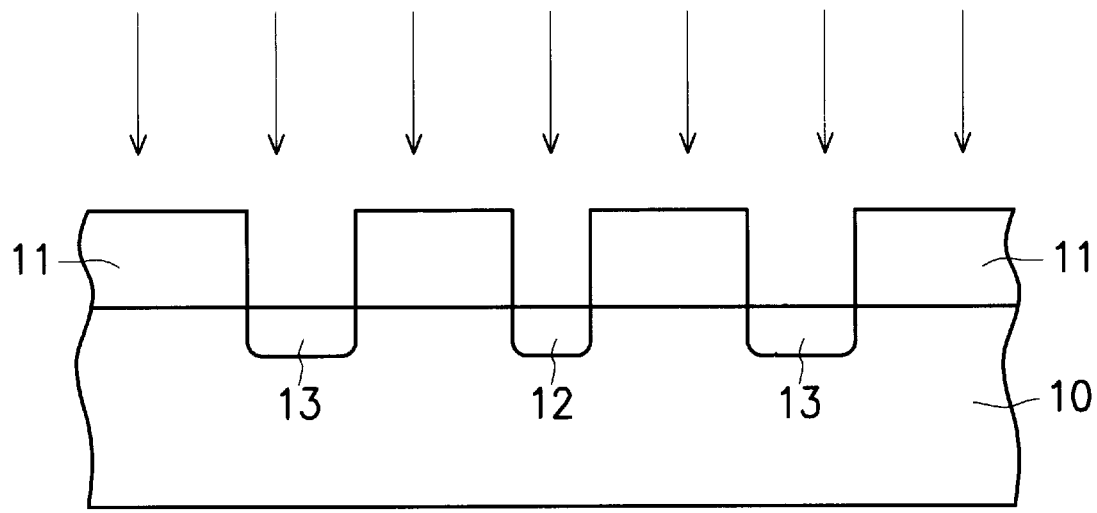
FIGS. 1A to 1D are cross-sectional views showing conventional process steps of fabricating split-gate flash memory cells.
Figure 1B:
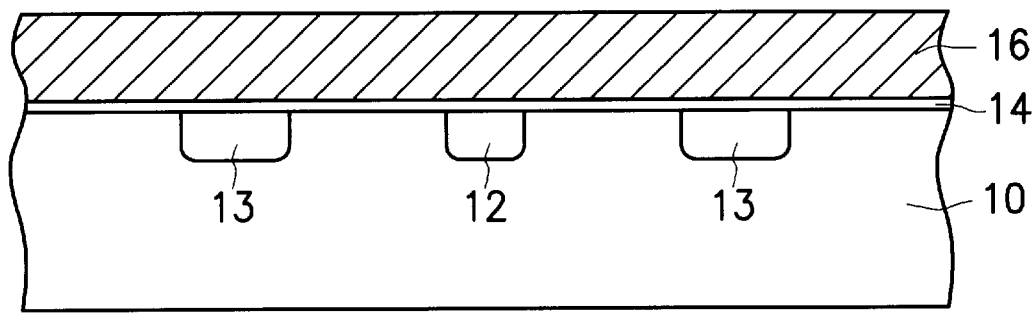
Figure 1C:
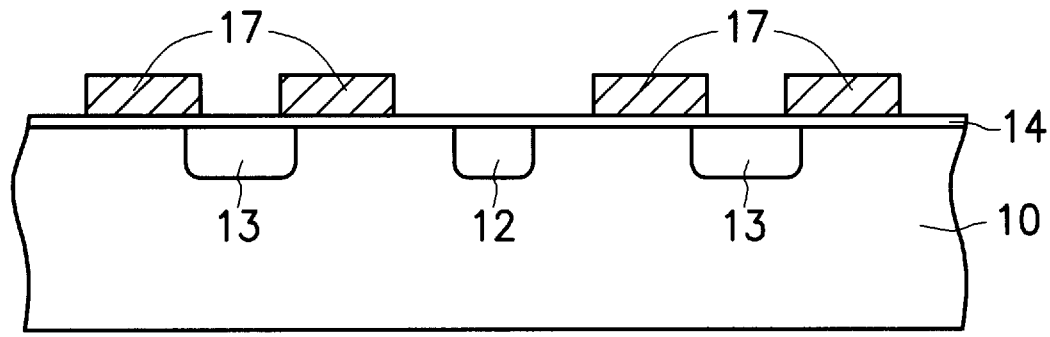
Figure 1D:
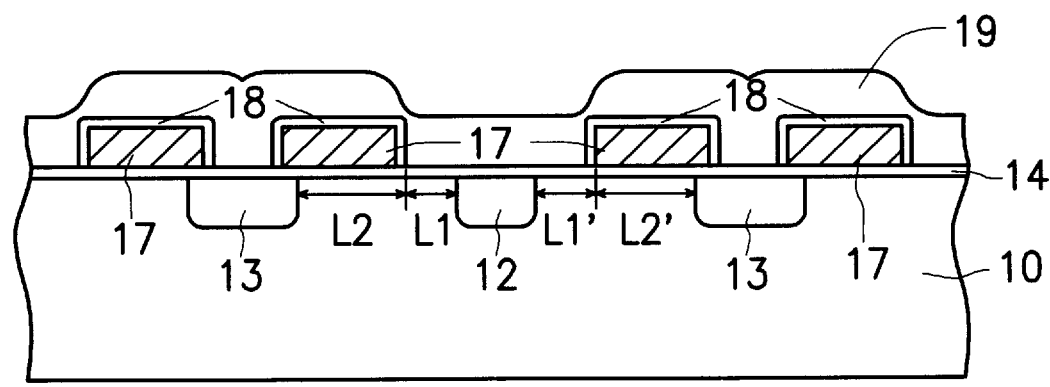
Figure 2:
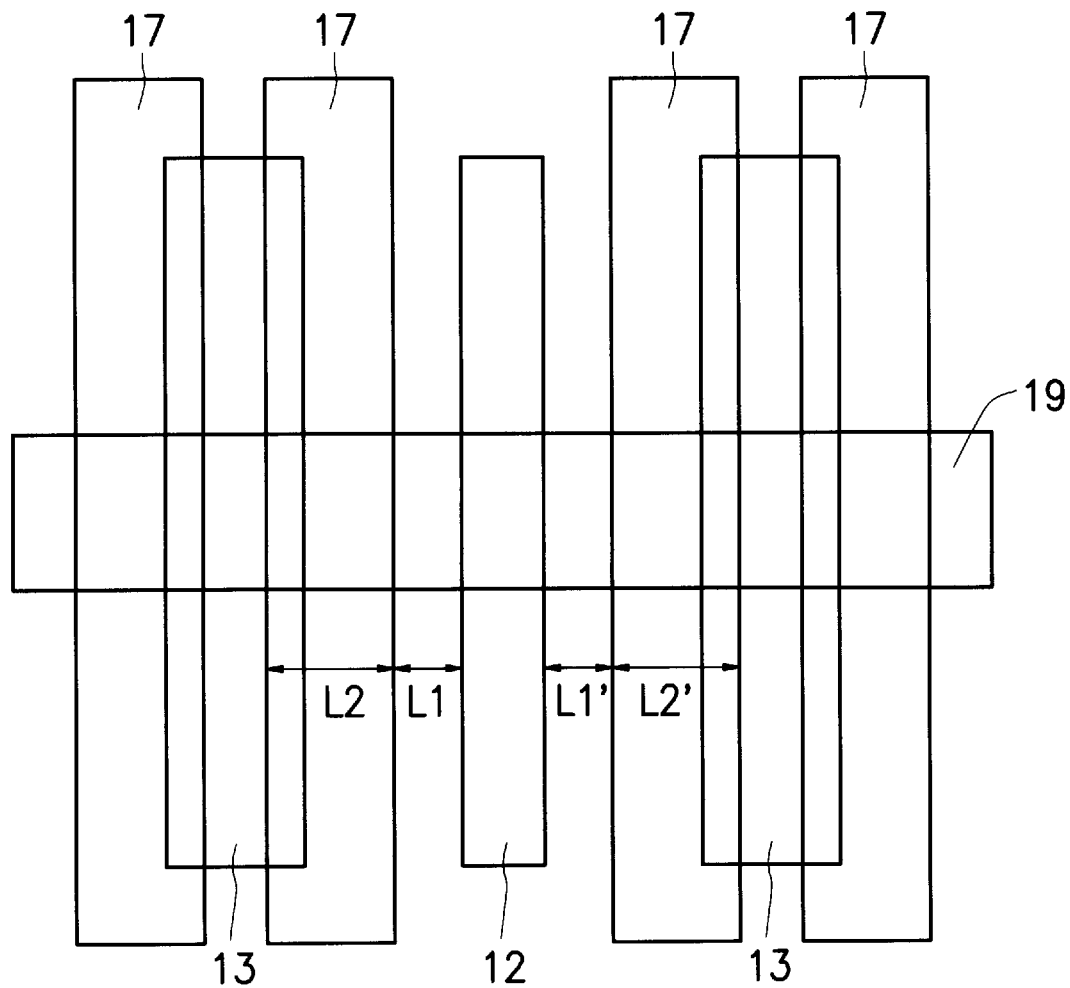
FIG. 2 is a top view showing conventional split-gate flash memory cell.
Figure 3A:
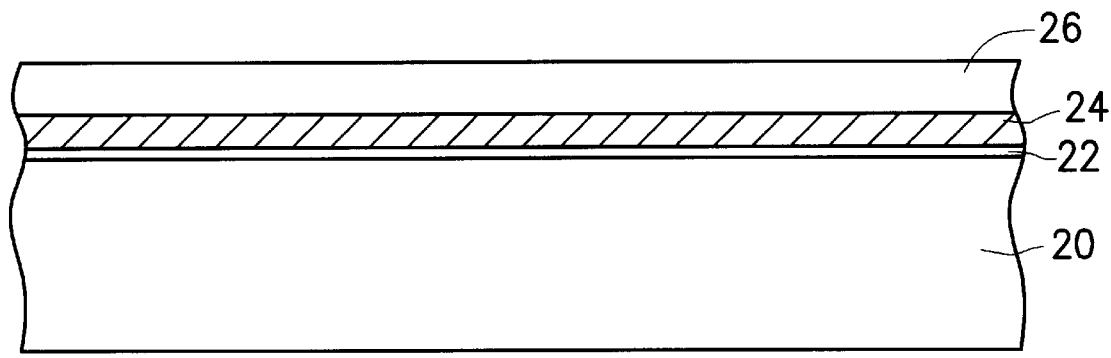
FIGS. 3A to 3G are cross-sectional views showing the process steps of fabricating split-gate flash memory cells according to one preferred embodiment of this invention.
Figure 3B:
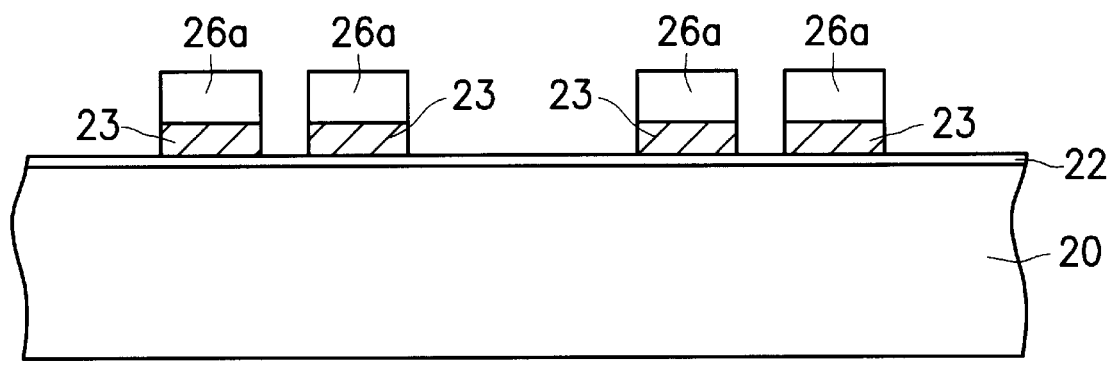

FIG. 3A through 3G show the fabricating progression of a split-gate flash memory according to one preferred embodiment of this invention. Referring to FIG. 3A, a floating gate oxide layer 22, a polysilicon layer 24, and a mask layer 26, for example, a silicon dioxide layer, are formed sequentially over a substrate 20, for example, a P-type substrate. A pattern is defined on the mask layer 26 and the polysilicon layer 24 to form a mask layer 26a and floating gates 23 as shown in FIG. 3B.

Figure 3C:
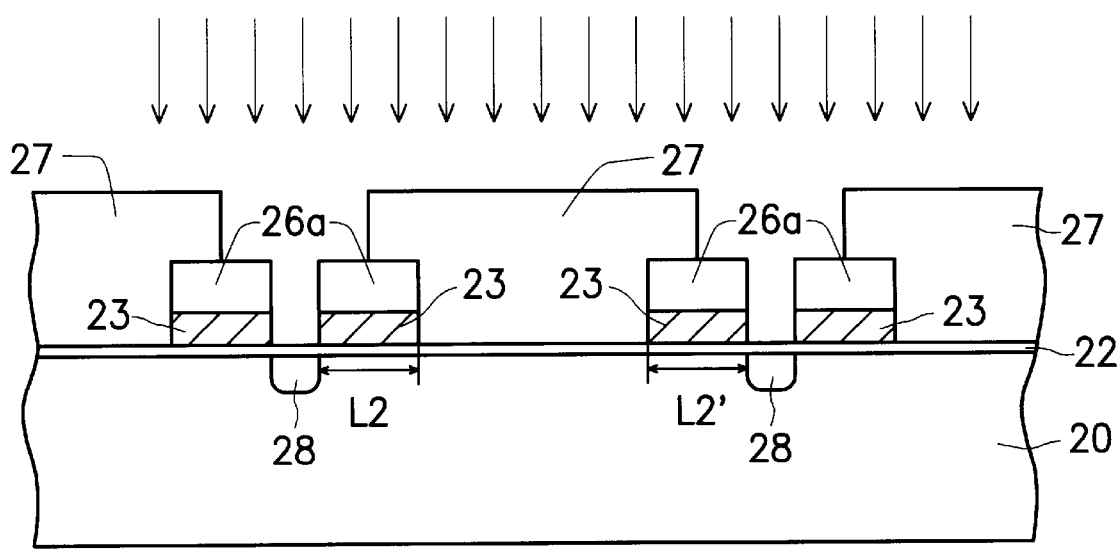

Next, referring to FIG. 3C, a photoresist layer 27 is coated over substrate 20. A pattern is defined on the photoresist layer 27 to expose the areas of substrate 20 desired to form drain regions. Using mask layer 26a and photoresist layer 27 as a mask, ions, for example, N-type ions, are implanted into substrate 20 to form drain regions 28. Floating gates 23 are not implanted because ions are stopped by mask layer 26a. The ions are implanted between the edges of the floating gates 23, so the channel width L2, is simply defined by the width of floating gate 23. Then, the photoresist layer 27 is removed.

Figure 3D:
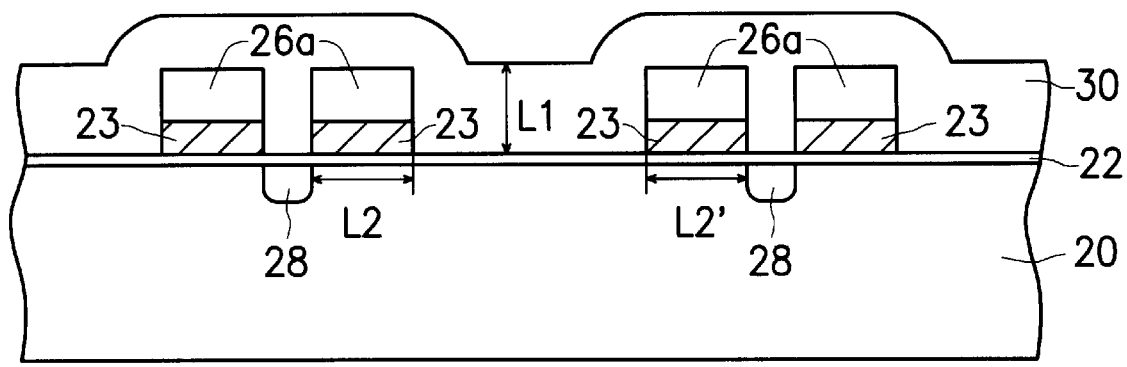
Figure 3E:
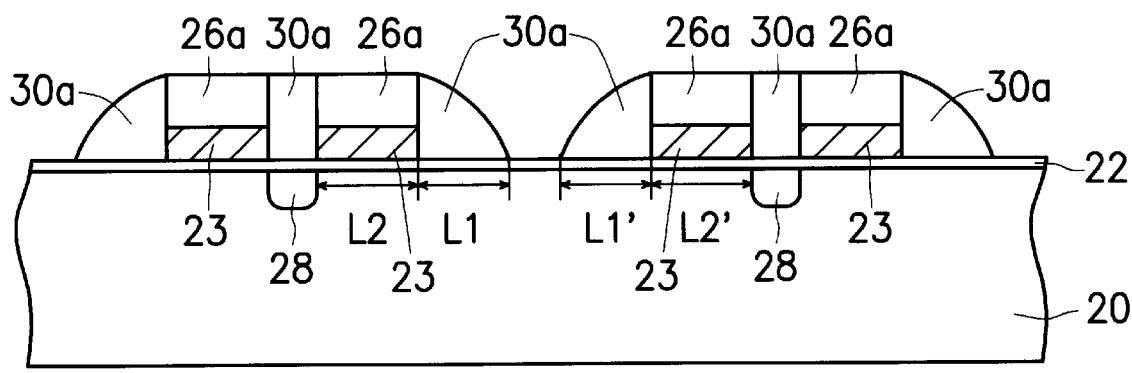

Referring to FIG. 3D, an insulating layer 30, for example, a silicon nitride layer, is formed over the substrate 20 and filled between floating gates 23. The thickness of the insulating layer is L1. An etching back process is performed on the insulating layer 30 to form spacers 30a on one side of the floating gate 23. The width of the spacers 30a is about L1. Therefore, the width of the spacers 30a can be determined by the thickness of insulating layer 30 as shown in FIG. 3E.

Figure 3F:
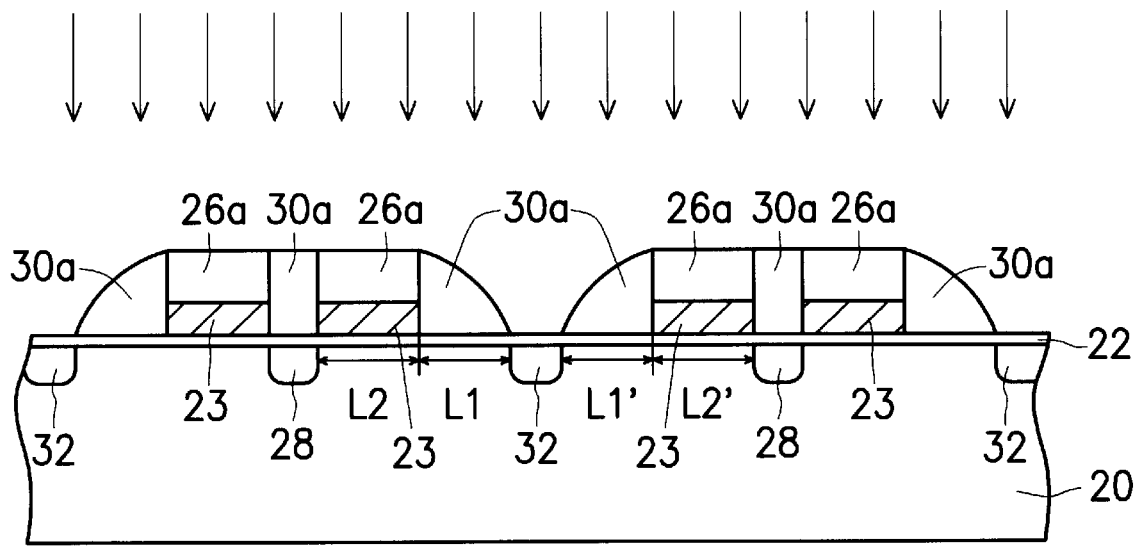

Referring to FIG. 3F, using the spacers and the mask layer 26a as a mask, ions, for example, N-type ions are implanted into the substrate 20 to form source regions 32. Since ions are implanted between the edges of spacers 30a, the interval, L1, between the source region 32 and the floating gate 23 is simply defined by the width of the spacers. Therefore, the interval between the source region 32 and the floating gate 23 will be same.

Figure 3G:
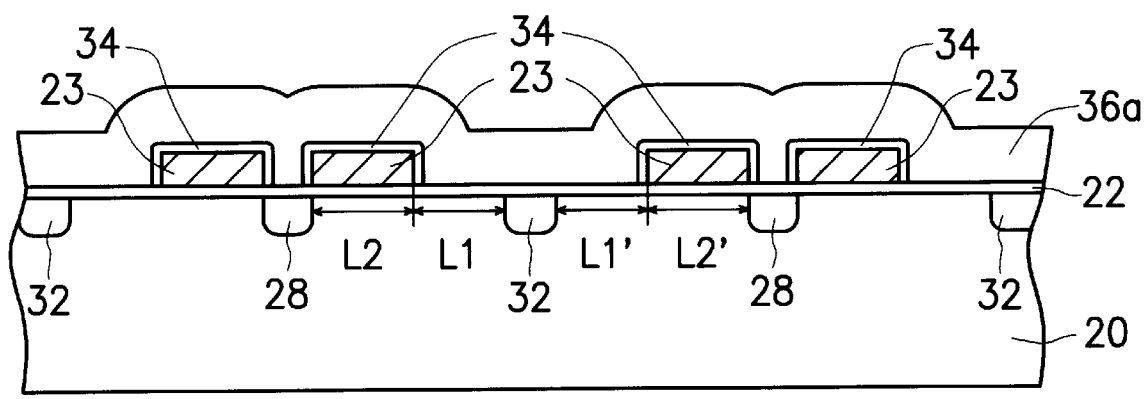

Finally, referring to FIG. 3G, the spacers 30a and the mask layer 26a are removed. A control gate oxide layer 34, for example, a silicon dioxide layer formed by thermal oxidation or chemical vapor deposition is formed over the substrate 20. Then, a control gate 36a is formed over the floating gates 23 and the substrate 20. The control gate 36a is formed by depositing a polysilicon layer over the substrate 20 and patterning the polysilicon layer.

According to this invention the method of fabricating split-gate flask memory solves the misalignment problem without increasing the number of masking steps. It can be sure that the L1 and L2 will be same. Compared to the conventional method, which needs a larger floating gate for a misalignment margin, this invention is smaller in size. Thus, the uniformity of cell performance is better controlled.

While the invention has been described by way of example and in terms of a preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating split-gate flash memory, comprising the sequential steps of:

forming sequentially a floating gate oxide layer, a first polysilicon layer, and a mask layer over a first conductivity type substrate;

patterning the mask layer and the first polysilicon layer to form floating gates having opposing sides;

coating a photoresist layer and patterning the photoresist layer to expose a portion of the substrate;

implanting second conductivity type ions into the exposed substrate to form drain regions;

removing the photoresist layer;

forming an insulating layer over the substrate and etching back the insulating layer to form spacers on one side of each floating gate and to completely fill spaces between adjacent floating gates on the other side of each floating gate;

implanting the second conductivity type ions into the substrate to form source regions;

removing the spacers and the mask layer;

forming sequentially a control gate oxide layer and a control gate over the substrate.

2. A method according to claim 1, wherein the first conductivity type is P type and the second conductivity type is N type.

3. A method according to claim 1, wherein the first conductivity type is N type and the second conductivity type is P type.

4. A method according to claim 1, wherein the mask layer includes a silicon dioxide layer.

5. A method according to claim 1, wherein the insulating layer includes a silicon nitride layer.

6. A method according to claim 1, wherein the control gate oxide layer includes a silicon dioxide layer formed by thermal oxidation.

7. A method according to claim 1, wherein the control gate oxide layer includes a silicon dioxide layer formed by chemical vapor deposition.

8. A method according to claim 1, wherein the control gate includes a polysilicon layer.

* * * * *